(12) United States Patent
Kim

(10) Patent No.: US 8,569,749 B2
(45) Date of Patent: Oct. 29, 2013

(54) ORGANIC LIGHT EMITTING DIODE DISPLAY HAVING GETTER AND METHOD OF MANUFACTURING THE SAME

(75) Inventor: Hoon Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 66 days.

(21) Appl. No.: 13/083,380

(22) Filed: Apr. 8, 2011

(65) Prior Publication Data
US 2012/0112212 A1    May 10, 2012

(30) Foreign Application Priority Data
Nov. 8, 2010   (KR) .................. 10-2010-0110572

(51) Int. Cl.
   *H01L 27/32*   (2006.01)
(52) U.S. Cl.
   USPC .......................................... 257/40; 349/158
(58) Field of Classification Search
   USPC ......... 257/88–100, 40; 349/158, 159, 267, 58
   See application file for complete search history.

(56) References Cited

U.S. PATENT DOCUMENTS

| | | | |
|---|---|---|---|
| 8,049,217 B2 * | 11/2011 | Sung et al. | 257/59 |
| 2007/0096631 A1 * | 5/2007 | Sung et al. | 313/498 |
| 2007/0212525 A1 * | 9/2007 | Sung et al. | 428/192 |
| 2007/0279571 A1 * | 12/2007 | Koo et al. | 349/153 |
| 2008/0143247 A1 * | 6/2008 | Kim et al. | 313/504 |
| 2009/0002625 A1 * | 1/2009 | Koo et al. | 349/158 |
| 2009/0039780 A1 * | 2/2009 | Kim et al. | 313/512 |
| 2009/0058292 A1 * | 3/2009 | Koo et al. | 313/512 |
| 2009/0128015 A1 * | 5/2009 | Kim et al. | 313/504 |
| 2009/0261341 A1 * | 10/2009 | Choi et al. | 257/72 |
| 2010/0013071 A1 * | 1/2010 | Chol et al. | 257/682 |
| 2011/0187629 A1 * | 8/2011 | Nam et al. | 345/76 |

FOREIGN PATENT DOCUMENTS

| | | |
|---|---|---|
| JP | 10-134959 A | 5/1998 |
| KR | 10-2007-0067506 A | 6/2007 |
| KR | 10-2009-0026928 A | 3/2009 |

* cited by examiner

*Primary Examiner* — Nathan Ha
(74) *Attorney, Agent, or Firm* — Knobbe Martens Olson & Bear LLP

(57) ABSTRACT

An organic light emitting diode (OLED) display is disclosed. In one embodiment, the OLED display includes first and second substrates, an OLED interposed between the first and second substrates and an external sealant formed between the first and second substrates and configured to i) substantially seal the first and second substrates and ii) substantially surround the OLED. The OLED display may further include a dam formed between the external sealant and the OLED and configured to substantially surround the OLED, and a getter formed between the external sealant and the dam.

6 Claims, 8 Drawing Sheets

ORGANIC LIGHT EMITTING DIODE DISPLAY HAVING GETTER AND METHOD OF MANUFACTURING THE SAME

RELATED APPLICATIONS

This application claims priority to and the benefit of Korean Patent Application No. 10-2010-0110572 filed in the Korean Intellectual Property Office on Nov. 8, 2010, the entire contents of which are incorporated herein by reference.

BACKGROUND

1. Field

The described technology generally relates to an organic light emitting diode (OLED) display and a method of manufacturing the same, for example, an OLED display including a getter having moisture absorption ability.

2. Description of the Related Technology

A display device displays an image, and nowadays, the OLED display is undergoing rapid improvement.

The OLED display has self luminance characteristics and does not require a separate light source, unlike a liquid crystal display (LCD) device. It thus provides a reduced thickness and weight. Further, the OLED display represents high quality characteristics of low power consumption, high luminance, and a high reaction speed.

SUMMARY

One inventive aspect is an OLED display having advantages of suppressing a failure from occurring in an OLED by a getter.

Another aspect is an OLED display including: a first substrate; an OLED that is positioned on the first substrate; a second substrate that is positioned on the first substrate with the OLED interposed therebetween; an external sealant that is positioned between the first substrate and the second substrate and that coheres and seals the first substrate and the second substrate and that encloses the OLED at a predetermined gap; a dam that is positioned between the external sealant and the OLED and that encloses the OLED; and a getter that is positioned between the external sealant and the dam.

The external sealant may include a light curable material.

The dam may include a thermosetting material.

The dam may include a moisture absorption material.

The getter may be cured from liquid to solid.

The OLED display may further include an internal sealant that is positioned between the external sealant and the getter.

The internal sealant may include a thermosetting material.

The second substrate may be an opaque substrate, and the OLED may emit light in a direction of the first substrate.

Another aspect is a method of manufacturing an OLED display, the method including: forming an external sealant that encloses an OLED at a predetermined gap from the OLED on a first substrate at which the OLED is positioned; forming a dam that encloses the OLED between the external sealant and the OLED; forming a liquid getter between the external sealant and the dam; and cohering and sealing the first substrate and the second substrate with the OLED interposed therebetween.

The cohering and sealing of the first substrate and the second substrate with the OLED interposed therebetween may include disposing the second substrate on the first substrate with the external sealant, the liquid getter, and the dam interposed therebetween; and curing the external sealant by radiating light to the external sealant.

The cohering and sealing of the first substrate and the second substrate may further include curing the dam by applying heat to the dam.

The liquid getter may be cured into a solid getter by the heat.

The method may further include forming an internal sealant between the external sealant and the OLED in order to position the internal sealant between the external sealant and the getter.

The cohering and sealing of the first substrate and the second substrate with the OLED interposed therebetween may include disposing the second substrate on the first substrate with the external sealant, the internal sealant, the liquid getter, and the dam interposed therebetween; and curing the external sealant by radiating light to the external sealant; and curing the internal sealant, the liquid getter, and the dam by applying heat to the internal sealant, the liquid getter, and the dam.

DETAILED DESCRIPTION

Figure 1:
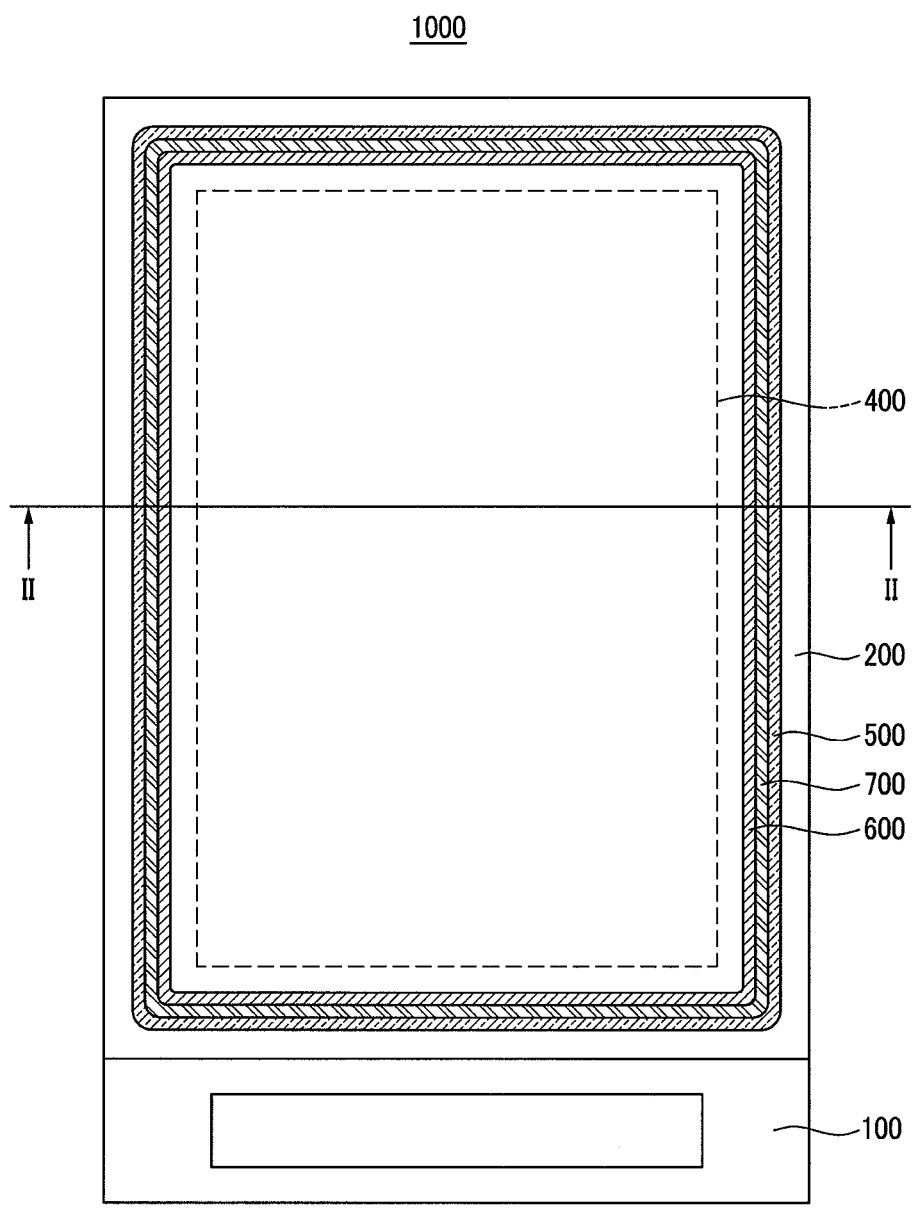
FIG. 1 is a top plan view illustrating an OLED display according to a first embodiment.

In general, an OLED display includes i) a first substrate, ii) an OLED that is positioned on the first substrate, iii) a second substrate that is opposite to the first substrate with the OLED interposed therebetween, iv) a sealant that coheres and seals the first substrate and the second substrate, and v) a getter that is positioned between the sealant and the OLED and that has moisture absorption ability.

However, when cohering and sealing the first substrate and the second substrate by the sealant, the getter may move in a direction of the OLED by an internal pressure that is formed between the first substrate and the second substrate and thus there is a problem that a failure occurs in the OLED.

Embodiments will be described more fully hereinafter with reference to the accompanying drawings. As those skilled in the art would realize, the described embodiments may be modified in various different ways.

The drawings and description are to be regarded as illustrative in nature and not restrictive. Like reference numerals designate like elements throughout the specification.

Further, in the drawings, a size and thickness of each element are randomly represented for better understanding and ease of description, and not considered limiting.

In the drawings, the thickness of layers, films, panels, regions, etc., may be exaggerated for clarity. In the drawings, for better understanding and ease of description, thicknesses of some layers and areas are excessively displayed. When it is said that any part, such as a layer, film, region, or plate, is positioned on another part, it means the part is directly on the other part or above the other part with at least one intermediate part.

In addition, unless explicitly described to the contrary, the word "comprise" and variations such as "comprises" or "comprising", will be understood to imply the inclusion of stated elements but not the exclusion of any other elements. Further, in the specification, it means that an upper part of a target portion indicates an upper part or a lower part of a target portion, and it does not mean that the target portion is always positioned at the upper side based on a gravity direction.

Further, for the purpose of convenience, in the accompanying drawings, an active matrix (AM) OLED display of a 2Tr-1 Cap structure having two thin film transistors (TFT) and one capacitor in one pixel is illustrated. However, the OLED display may have two or more capacitors and three or more TFTs in one pixel, and a separate wire may be further formed and thus the OLED display may have various structures. Here, a pixel is a minimum unit that displays an image, and the OLED display displays an image through a plurality of pixels.

Hereinafter, an OLED display according to a first embodiment will be described with reference to FIGS. 1 to 4.

Figure 2:
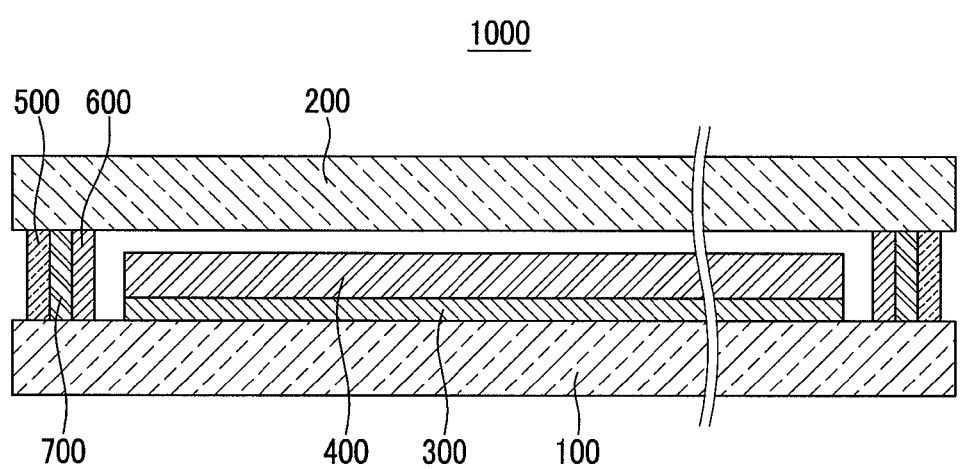
FIG. 2 is a cross-sectional view illustrating the OLED display taken along line II-II of FIG. 1.

FIG. 1 is a top plan view illustrating an OLED display according to a first embodiment. FIG. 2 is a cross-sectional view illustrating the OLED display taken along line II-II of FIG. 1.

As shown in FIGS. 1 and 2, an OLED display 1000 includes a first substrate 100, a second substrate 200, a wire portion 300, an OLED 400, an external sealant 500, a dam 600, and a getter 700.

At least one of the first and second substrates 100 and 200 may be formed at least partially of glass, polymer, or a metal. The first substrate 100 may be made of a light transmitting material, and the second substrate 200 may be made of a light opaque material. In one embodiment, the second substrate is an opaque substrate including aluminum (Al) or copper (Cu). The wire portion 300 and the OLED 400 are positioned on the first substrate 100, and the second substrate 200 is opposite to the first substrate 100 with the wire portion 300 and the OLED 400 interposed therebetween. The first substrate 100 and the second substrate 200 are cohered and sealed by the external sealant 500 with the OLED 400 interposed therebetween, and the first substrate 100 and the second substrate 200 protect the wire portion 300 and the OLED 400 from external impact or the environment.

In the OLED display 1000, the second substrate 200 may be made of a light opaque material, but in an OLED display 1000 according to another embodiment, at least one of the first substrate and the second substrate is made of a light transmitting material.

The wire portion 300 includes a first TFT 10 and a second TFT 20 (shown in FIG. 3) and drives the OLED 400 by transferring a signal to the OLED 400. The OLED 400 emits light according to a signal that is received from the wire portion 300.

The OLED 400 is positioned on the wire portion 300.

The OLED 400 is positioned on the first substrate 100, and receives a signal from the wire portion 300 and displays an image by the received signal.

Hereinafter, an internal structure of an OLED display according to a first embodiment will be described in detail with reference to FIGS. 3 and 4.

Figure 3:
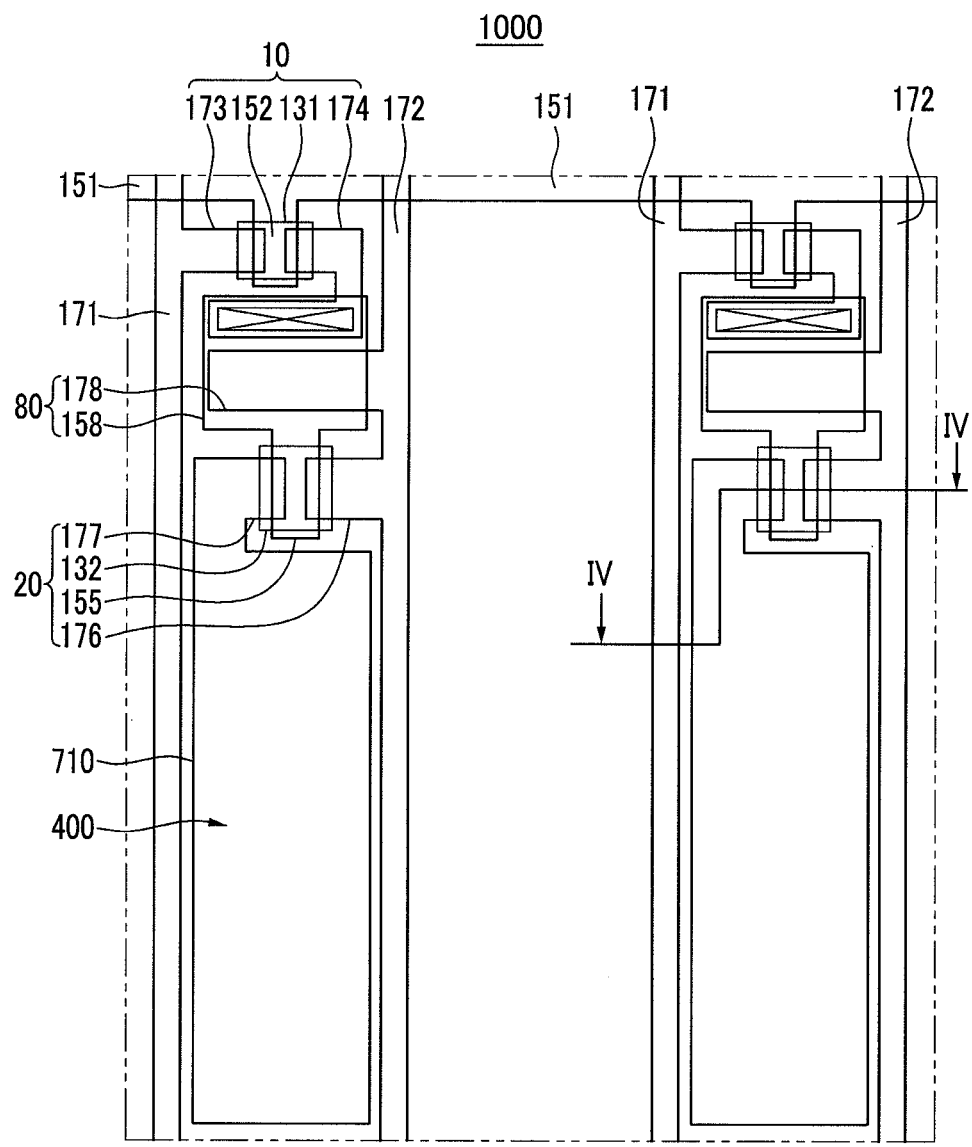
FIG. 3 is a layout view illustrating a structure of a pixel of an OLED display according to the first embodiment.

FIG. 3 is a layout view illustrating a structure of a pixel of an OLED display according to a first embodiment. FIG. 4 is a cross-sectional view illustrating the pixel taken along line IV-IV of FIG. 3.

Figure 4:
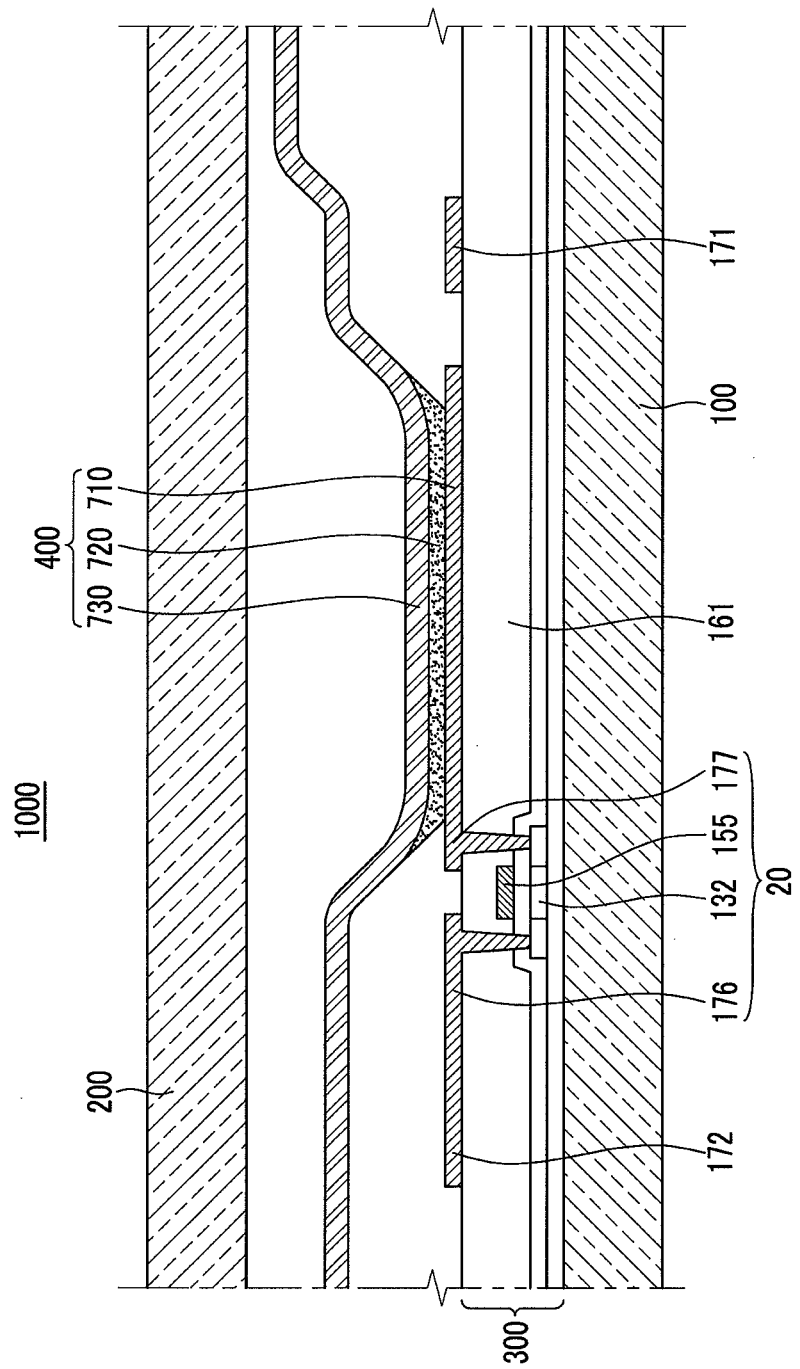
FIG. 4 is a cross-sectional view illustrating the pixel taken along line IV-IV of FIG. 3.

Hereinafter, a detailed structure of the wire portion 300 and the OLED 400 is illustrated in FIGS. 3 and 4, but the embodiment shown in FIGS. 3 and 4 is not considered limiting. The wire portion 300 and the OLED 400 can be formed in various structures within a range that can be easily modified by a person of ordinary skill in the art. In one embodiment, in the accompanying drawings, an AM OLED display of a 2Tr-1 Cap structure having two TFTs and one capacitor in one pixel is illustrated as an OLED display. In another embodiment, a display device is not limited to the quantity of the TFT, the quantity of the capacitor, and the quantity of the wire. The pixel is a minimum unit that displays an image, and the OLED display displays an image using a plurality of pixels.

As shown in FIGS. 3 and 4, the OLED display 1000 includes a switching TFT 10, a driving TFT 20, a capacitor 80, and an OLED 400 that are each formed in one pixel. Here, a configuration including the switching TFT 10, the driving TFT 20, and the capacitor 80 is referred to as a wire portion 300. The wire portion 300 further includes a gate line 151 that is disposed along one direction of the first substrate 100 and a data line 171 and a common power source line 172 that are insulated from the gate line 151 and that intersects the gate line 151. Here, a pixel is defined using the gate line 151, the data line 171, and the common power source line 172 as a boundary, but a pixel is not limited thereto.

The OLED 400 includes a first electrode 710, an organic emission layer 720 that is formed on the first electrode 710, and a second electrode 730 that is formed on the organic emission layer 720. Here, the first electrode 710 may be an anode, which is a hole injection electrode, and the second electrode 730 may be a cathode, which is an electron injection electrode. However, the first electrode 710 may become a cathode and the second electrode 730 may become an anode according to a driving method of the OLED display 1000. When holes and electrons are injected into the organic emission layer 720 from the first electrode 710 and the second electrode 730, respectively, and excitons in which holes and electrons that are injected into the organic emission layer 720 are coupled drop from an exited state to a ground state, the organic emission layer 720 emits light. Further, the first electrode 710 is formed in a light transmitting structure, and the second electrode 730 is formed in a light reflecting structure. Thereby, the OLED 400 emits light in a direction of the first substrate 100.

In the OLED display according to another embodiment, at least one of the first electrode and the second electrode can be formed in a light transmitting structure, and the OLED can emit light in a direction of at least one of the first substrate and the second substrate. That is, the OLED display may be a front light emitting type, a rear light emitting type, or both surface light emitting type.

The capacitor 80 includes a pair of capacitor plates 158 and 178 that are disposed with the interlayer insulating layer 161 interposed therebetween. Here, the interlayer insulating layer 161 becomes a dielectric material, and a capacitor capacity of the capacitor 80 is determined by charges that are stored in the capacitor 80 and a voltage between both capacitor plates 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 is used as a switch for selecting a pixel to emit light. The switching gate electrode 152 is connected to the gate line 151. The switching source electrode 173 is connected to the data line 171. The switching drain electrode 174 is separated from the switching source electrode 173 and is connected to one capacitor plate 158.

The driving TFT 20 applies a driving power source for allowing light emission of the organic emission layer 720 of the OLED 400 within the selected pixel to the second electrode 730. The driving gate electrode 155 is connected to the capacitor plate 158 that is connected to the switching drain electrode 174. The driving source electrode 176 and the other one capacitor plate 178 are each connected to the common power source line 172. The driving drain electrode 177 is positioned at the same layer as that of the first electrode 710 and is connected to the first electrode 710.

By such a structure, the switching TFT 10 operates by a gate voltage that is applied to the gate line 151 to perform a function of transferring a data voltage that is applied to the data line 171 to the driving TFT 20. A voltage corresponding to a difference between a common voltage that is applied from the common power source line 172 to the driving TFT 20 and a data voltage that is transferred from the switching TFT 10 is stored in the capacitor 80, and a current corresponding to a voltage that is stored in the capacitor 80 flows to the OLED 400 through the driving TFT 20 and thus the OLED 400 emits light.

Referring again to FIGS. 1 and 2, the external sealant 500 is positioned between the first substrate 100 and the second substrate 200, encloses the OLED 400 at a predetermined gap, and is disposed along edges of the first substrate 100 and the second substrate 200 to cohere and seal the first substrate 100 and the second substrate 200. In one embodiment, the external sealant 500 includes an organic material including epoxy, acryl, and silicon, etc., in which a light curable material is included, or an organic and inorganic material in which talc, calcium oxide (CaO), barium oxide (BaO), zeolite, and silicon oxide (SiO) are included in an organic material, and is cured by light of ultraviolet (UV) rays, etc.

The dam 600 is positioned between the external sealant 500 and the OLED 400 between the first substrate 100 and the second substrate 200.

The dam 600 encloses the OLED 400 between the external sealant 500 and the OLED 400 and coheres and seals the first substrate 100 and the second substrate 200 together with the external sealant 500. In one embodiment, the dam 600 includes an organic material including epoxy, acryl, and silicon in which a thermosetting material is included, or an organic and inorganic material in which talc, calcium oxide (CaO), barium oxide (BaO), zeolite, and silicon oxide (SiO) are included in, an organic material, and is cured by heat. Further, the dam 600 may include a moisture absorption material such as a filler that absorbs moisture, and as the dam 600 includes a moisture absorption material, moisture that may be penetrated from the outside to the OLED 400 is intercepted by the dam 600. This functions as a factor of improving a life-span of the OLED 400.

The getter 700 is positioned between the dam 600 and the external sealant 500.

The getter 700 is closed and sealed by the external sealant 500, the dam 600, the first substrate 100, and the second substrate 200 between the external sealant 500 and the dam 600. The getter 700 has moisture absorption ability and performs a function of intercepting moisture that may be penetrated from the outside to the OLED 400 through the external sealant 500. That is, moisture that may be penetrated from the outside to the OLED 400 is intercepted by the getter 700. This functions as a factor of improving a life-span of the OLED 400. Particularly, the getter 700 is positioned between the external sealant 500 and the dam 600 in a cured state from liquid of a paste form to solid.

As described above, in the OLED display 1000 according to the first embodiment, as the getter 700 is positioned between the external sealant 500 and the dam 600, a failure is prevented from occurring in the OLED 400 by the getter 700. For example, the getter 700 is cured from liquid of a paste form to solid, and when manufacturing the OLED display 1000, even if the getter 700 is in a liquid phase, the getter 700 is intercepted from flowing in a direction of the OLED 400 by the dam 600, and thus a failure is prevented from occurring in the OLED 400 as the getter 700 flows to the OLED 400. Further, when the getter 700 is cured from liquid to solid, even if gas is generated in the getter 700, the gas is intercepted from moving in a direction of the OLED 400 by the dam 600, and thus a failure is prevented from occurring in the OLED 400 as gas that is generated from the getter 700 moves to the OLED 400.

Further, as moisture that may be penetrated from the outside to the OLED 400 is sequentially intercepted by the external sealant 500, the getter 700, and the dam 600, it is minimized that moisture penetrates to the OLED 400, whereby a life-span of the OLED 400 is improved and thus a life-span of the OLED display 1000 is improved.

Moreover, as the first substrate 100 and the second substrate 200 are cohered and sealed by the external sealant 500 and the dam 600, a bonding force between the first substrate 100 and the second substrate 200 is improved and thus the first substrate 100 and the second substrate 200 are suppressed from being separated from each other by an external impact. That is, mechanical strength of the OLED display 1000 is improved.

Further, as the external sealant 500 includes a light curable material and the dam 600 includes a thermosetting material, even if the second substrate 200 is an opaque substrate, the external sealant 500 is cured using light such as UV rays and the dam 600 is cured using heat. That is, because the second substrate 200 is an opaque substrate, by curing the external sealant 500 using a thermosetting means such as UV rays, the first substrate 100 and the second substrate 200 can be cohered and sealed, and the dam 600 can be cured using heat and thus when manufacturing an OLED display 1000, a cohesion process and a heat treatment process can be separated.

By forming both the external sealant 500 and the dam 600 to include a thermosetting material, the external sealant 500 and the dam 600 can be cured at one time by a heat treatment process of one time.

Hereinafter, a method of manufacturing an OLED display according to a second embodiment will be described with reference to FIGS. 5 to 7. The OLED display 1000 according to the first embodiment is manufactured by a method of manufacturing an OLED display according to the second embodiment.

Figure 5:
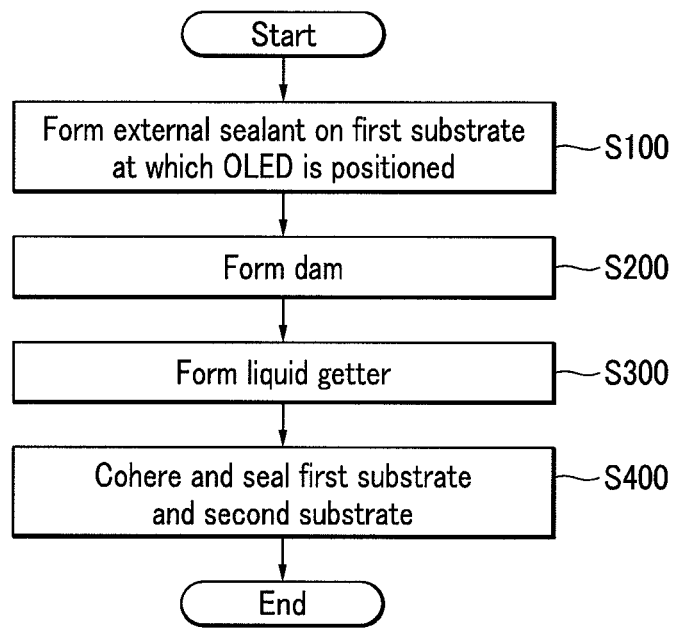
FIG. 5 is a flowchart illustrating a method of manufacturing an OLED display according to a second embodiment.

FIG. 5 is a flowchart illustrating a method of manufacturing an OLED display according to a second embodiment. FIGS. 6 and 7 are cross-sectional views illustrating a method of manufacturing an OLED display according to a second embodiment.

Figure 6:
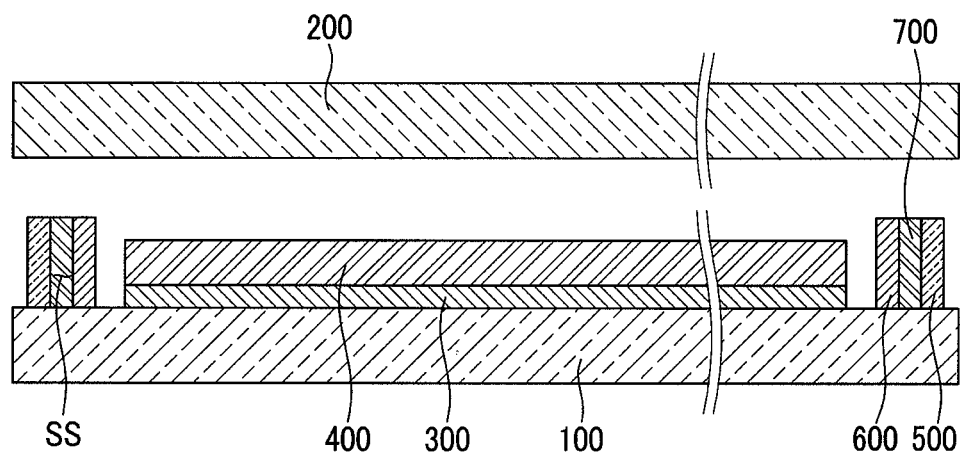
FIGS. 6 and 7 are cross-sectional views illustrating a method of manufacturing an OLED display according to the second embodiment.

First, as shown in FIGS. 5 and 6, the external sealant 500 is formed on the first substrate 100 at which the OLED 400 is positioned (S100).

Specifically, after the wire portion 300 and the OLED 400 are formed on the first substrate 100, the external sealant 500 is formed on the first substrate 100 so as to enclose the OLED 400 at a predetermined gap from the OLED 400. In one embodiment, the external sealant 500 is made of an organic material or an organic and inorganic composite material including a light curable material using an application process or a printing process.

Next, the dam 600 is formed (S200).

Specifically, the dam 600 is formed between the external sealant 500 and the OLED on the first substrate 100 in which the external sealant 500 is formed. In one embodiment, the dam 600 is made of a material including a thermosetting material using an application process or a printing process and as the dam 600 is formed, a predetermined separation space SS is formed between the external sealant 500 and the dam 600.

The external sealant and the dam may be substantially simultaneously formed on the first substrate, or after the dam is formed on the first substrate, the external sealant may be formed on the first substrate.

Next, the liquid getter 700 is formed (S300).

Specifically, the liquid getter 700 of a paste form is formed in the predetermined separation space SS that is formed between the external sealant 500 and the dam 600. The liquid getter 700 can be formed using an application process, a dropping process, or an ejecting process. The liquid getter 700 has fluidity, but as the external sealant 500 and the dam 600 limit a flow area of the liquid getter 700, the liquid getter 700 is positioned only at the separation space SS.

In this way, as the liquid getter 700 having fluidity is formed in the predetermined separation space SS that is formed between the external sealant 500 and the dam 600, when the OLED display 1000 is manufactured, while the liquid getter 700 does not flow to the environment, the liquid getter 700 does not flow to a portion at which the OLED 400 is positioned and thus a failure is prevented from occurring by the getter 700.

Figure 7:
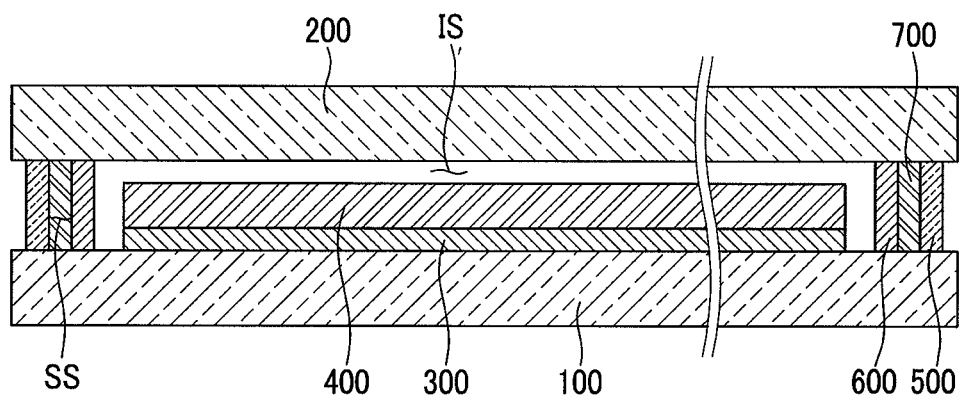

Next, as shown in FIG. 7, the first substrate 100 and the second substrate 200 are cohered and sealed (S400).

Hereinafter, cohering and sealing of the first substrate 100 and the second substrate 200 will be described in detail.

First, the second substrate 200, which is an opaque substrate is disposed on the first substrate 100 at which the OLED 400 is positioned with the external sealant 500, the liquid getter 700, and the dam 600 interposed therebetween. In this case, as the second substrate 200 contacts with the external sealant 500 and the dam 600, the liquid getter 700 is enclosed and sealed by the first substrate 100, the second substrate 200, the external sealant 500, and the dam 600.

Next, by radiating light such as UV rays to the external sealant 500 that is exposed to the outside, the external sealant 500 is cured. As the external sealant 500 is cured, the liquid getter 700, the dam 600, and the OLED 400 that are positioned at the inside of the external sealant 500 are closed and sealed by the first substrate 100, the second substrate 200, and the external sealant 500.

Next, by applying heat to the dam 600, the dam 600 is cured.

Specifically, the dam 600 is cured by applying heat in a direction of the dam 600 from the outside of the first substrate 100 and the second substrate 200.

As fluidity of a material including a thermosetting material that is included in the dam 600 rapidly rises in a predetermined temperature and heating time period, even if a small pressure is applied, a form of the material may be deformed and when a pressure is applied to an internal space IS between the first substrate 100 and the second substrate 200, the dam 600 flows in a direction of the OLED 400, whereby the liquid getter 700 flows in a direction of the OLED 400 and thus a failure may occur in the OLED 400.

However, in one embodiment, even if a pressure is applied to the internal space IS between the first substrate 100 and the second substrate 200 and fluidity of a material including a thermosetting material that is included in the dam 600 rapidly rises, the external sealant 500 has been already cured by light and thus the dam 600 is in a closed and sealed state by the first substrate 100, the second substrate 200, and the external sealant 500, whereby a form of the dam 600 is not deformed and is cured by heat. In this case, the liquid getter 700 is cured into the solid getter 700 by heat for curing the dam 600.

In this way, the first substrate 100 and the second substrate 200 are cohered and sealed and thus the OLED display 1000 is manufactured.

As described above, a method of manufacturing the OLED display according to the second embodiment is performed in consideration of characteristics of a material including a thermosetting material in which fluidity rapidly rises in a predetermined temperature and heating time period. Unlike a method of manufacturing the OLED display according to the second embodiment, for convenience of a process, by forming the external sealant 500 and the dam 600 to include a thermosetting material when the external sealant 500 and the dam 600 are cured using heat, as fluidity of the external sealant 500 and the dam 600 rapidly rises in a predetermined temperature and heating time period, a form thereof is deformed and thus the liquid getter 700 that is positioned at the separation space SS between the external sealant 500 and the dam 600 flows in a direction of the OLED 400 and thus a failure may occur in the OLED 400.

That is, in a method of manufacturing the OLED display according to the second embodiment, when the second substrate 200 is an opaque substrate, in consideration of characteristics of a material including a thermosetting material, the external sealant 500 is formed to include a material including a light curable material to be first cured using light, and the dam 600 is formed to include a material including a thermosetting material to be cured together with the liquid getter 700. Thereby, when manufacturing the OLED display 1000, the liquid getter 700 is prevented from flowing to the OLED 400, and thus a production yield of the OLED display 1000 is improved.

Hereinafter, an OLED display according to a third embodiment will be described with reference to FIG. 8.

Hereinafter, only characteristic portions different from the first embodiment are described and portions in which a description is omitted follow a description of the first embodiment. In the third embodiment, for better comprehension and ease of description, constituent elements identical to or corresponding to those according to the first embodiment are denoted by the same reference numerals.

Figure 8:
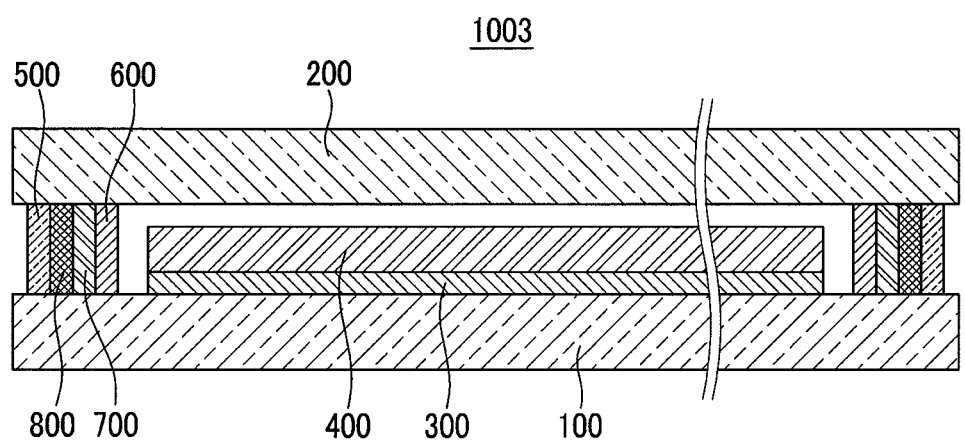
FIG. 8 is a cross-sectional view illustrating an OLED display according to a third embodiment.

FIG. 8 is a cross-sectional view illustrating an OLED display according to a third embodiment.

As shown in FIG. 8, an OLED display 1003 according to a third exemplary embodiment includes a first substrate 100, a second substrate 200, a wire portion 300, an OLED 400, an external sealant 500, a dam 600, a getter 700, and an internal sealant 800.

The internal sealant 800 is positioned between the external sealant 500 and the getter 700 and encloses the OLED 400. The internal sealant 800 coheres and seals the first substrate 100 and the second substrate 200 together with the external sealant 500 and the dam 600. In one embodiment, the internal sealant 800 includes an organic material including epoxy, acryl, and silicon in which a thermosetting material is included or an organic and inorganic material in which talc, calcium oxide (CaO), barium oxide (BaO), zeolite, and silicon oxide (SiO) are included in an organic material, and is cured by heat.

As described above, in the OLED display 1003 according to the third embodiment, as the getter 700 is positioned between the internal sealant 800 and the dam 600, a failure is prevented from occurring in the OLED 400 by the getter 700. For example, the getter 700 is cured from liquid of a paste form to solid, and when the OLED display 1003 is manufactured, even if the getter 700 is in a liquid phase, the getter 700 is intercepted from flowing in a direction of the OLED 400 by the dam 600, and thus a failure is prevented from occurring in the OLED 400 as the getter 700 flows to the OLED 400. Further, when the getter 700 is cured from liquid to solid, even if gas is generated from the getter 700, the gas is intercepted from moving in a direction of the OLED 400 by the dam 600, and therefore gas that is generated in the getter 700 moves to the OLED 400, and thus a failure is prevented from occurring in the OLED 400.

Further, in the OLED display 1003 according to the third embodiment, as moisture that may penetrate from the outside to the OLED 400 is sequentially intercepted by the external sealant 500, the internal sealant 800, the getter 700, and the dam 600, it is minimized that moisture penetrates to the OLED 400, w hereby a life-span of the OLED 400 is improved and thus a life-span of the OLED display 1003 is improved.

Further, in the OLED display 1003 according to the first embodiment, as the first substrate 100 and the second substrate 200 are cohered and sealed by the external sealant 500, the internal sealant 800, and the dam 600, a bonding force between the first substrate 100 and the second substrate 200 is improved and thus the first substrate 100 and the second substrate 200 are suppressed from separating by an external impact. That is, mechanical strength of the OLED display 1003 is improved.

Further, in the OLED display 1003 according to the first embodiment, as the external sealant 500 includes a light curable material and the internal sealant 800 and the dam 600 include a thermosetting material, even if the second substrate 200 is an opaque substrate, the external sealant 500 can be cured using light such as UV rays, and the internal sealant 800 and the dam 600 can be cured using heat. That is, because the second substrate 200 is an opaque substrate, the first substrate 100 and the second substrate 200 can be cohered and sealed by curing the external sealant 500 using a thermosetting means such as UV rays, and then the internal sealant 800 and the dam 600 can be cured using heat and thus when the OLED display is manufactured, a cohesion process and a heat treatment process can be separated.

Hereinafter, a method of manufacturing an OLED display according to a fourth embodiment will be described with reference to FIGS. 9 and 10. The OLED display 1003 according to the third embodiment is manufactured by the method of manufacturing an OLED display according to the fourth embodiment.

Hereinafter, only characteristic portions different from the second embodiment will be described and portions in which a description is omitted follow a description of the second embodiment. In the fourth embodiment, for better comprehension and ease of description, constituent elements identical to or corresponding to those of the second embodiment are denoted by the same reference numerals.

Figure 9:
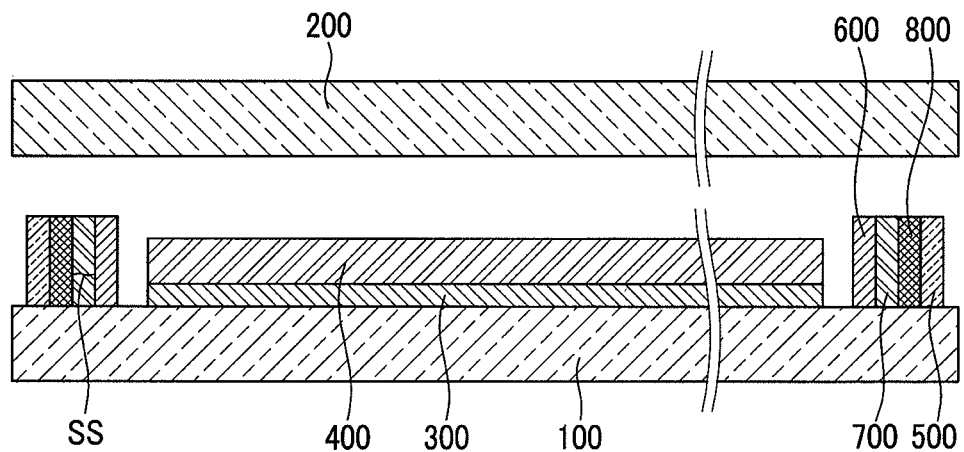
FIGS. 9 and 10 are cross-sectional views illustrating a method of manufacturing an OLED display according to a fourth embodiment.
Figure 10:
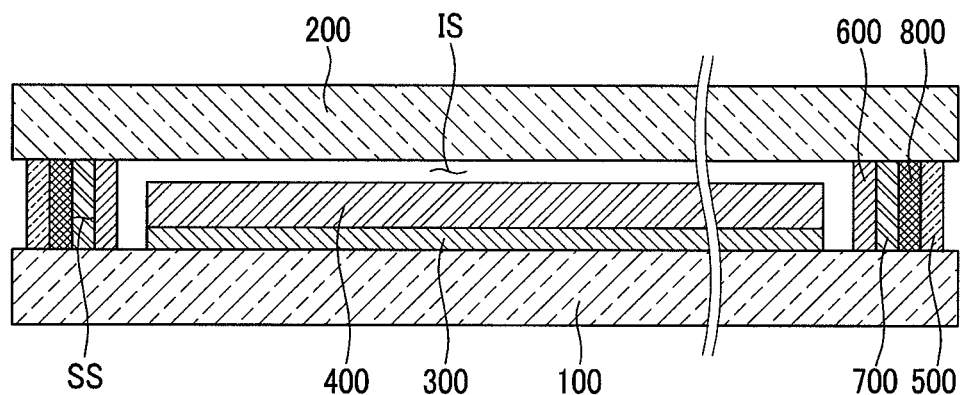

FIGS. 9 and 10 are cross-sectional views illustrating a method of manufacturing an OLED display according to a fourth embodiment.

As shown in FIG. 9, the external sealant 500 is formed on the first substrate 100 at which the OLED 400 is positioned.

Next, the internal sealant 800 is formed between the external sealant 500 and the OLED 400 so as to position between the external sealant 500 and the getter 700 to be formed later.

Specifically, the internal sealant 800 is formed between the external sealant 500 and an OLED on the first substrate 100 in which the external sealant 500 is formed. The internal sealant 800 is made of a material including a thermosetting material using an application process or a printing process. The internal sealant 800 may be formed simultaneously or in a different order with the external sealant 500 and may contact with or be separated from the external sealant 500.

Next, the dam 600 is formed.

In a method of manufacturing an OLED display according to another exemplary embodiment, an external sealant, an internal sealant, and a dam may be simultaneously formed on the first substrate, or after a dam is formed on the first substrate, an external sealant and an internal sealant may be formed on the first substrate.

Next, the liquid getter 700 is formed.

Next, as shown in FIG. 10, the first substrate 100 and the second substrate 200 are cohered and sealed.

Hereinafter, cohering and sealing of the first substrate 100 and the second substrate 200 will be described in detail.

First, the second substrate 200, which is an opaque substrate is disposed on the first substrate 100 at which the OLED 400 is positioned with the external sealant 500, the internal sealant 800, the liquid getter 700, and the dam 600 interposed therebetween. In this case, as the second substrate 200 contacts with the external sealant 500, the internal sealant 800, and the dam 600, the liquid getter 700 is enclosed and sealed by the first substrate 100, the second substrate 200, the internal sealant 800, and the dam 600.

Next, by radiating light such as UV rays to the external sealant 500 that is exposed to the outside, the external sealant 500 is cured. As the external sealant 500 is cured, the internal sealant 800, the liquid getter 700, the dam 600, and the OLED 400 that are positioned at the inside of the external sealant 500 are closed and sealed by the first substrate 100, the second substrate 200, and the external sealant 500.

Next, by applying heat to the internal sealant 800, the liquid getter 700, and the dam 600, the internal sealant 800, the liquid getter 700, and the dam 600 are cured.

Specifically, by applying heat in a direction of the internal sealant 800, the liquid getter 700, and the dam 600 from the outside of the first substrate 100 and the second substrate 200, the internal sealant 800, the liquid getter 700, and the dam 600 are cured.

In this case, in a method of manufacturing an OLED display according to a fourth embodiment, even if a pressure is applied to the inner space IS between the first substrate 100 and the second substrate 200 and fluidity of a material including a thermosetting material that is included in the internal sealant 800 and the dam 600 rapidly increases, the external sealant 500 has been already cured by light and thus the internal sealant 800 and the dam 600 are in a closed and sealed state by the first substrate 100, the second substrate 200, and the external sealant 500, whereby a form of the internal sealant 800 and the dam 600 is not deformed and is cured by heat. In this case, the liquid getter 700 is cured into the solid getter 700 by heat for curing the internal sealant 800 and the dam 600.

In this way, the first substrate 100 and the second substrate 200 are cohered and sealed and thus an OLED display 1003 is manufactured.

As described above, in a method of manufacturing an OLED display according to the fourth embodiment, when the second substrate 200 is an opaque substrate, in consideration of characteristics of a material including a thermosetting material, the external sealant 500 is formed to include a material including a light curable material to be first cured using light, and the internal sealant 800 and the dam 600 are formed to include a material including a thermosetting material to be cured together with the liquid getter 700. Thereby, when manufacturing the OLED display 1003, the liquid getter 700 is prevented from flowing to the OLED 400, and thus a production yield of the OLED display 1003 is improved.

At least one of the disclosed embodiments provide an OLED display in which a failure is suppressed from occurring in an OLED by a getter.

While this disclosure has been described in connection with certain embodiments, it is to be understood that these embodiments are not considered limiting. Thus, various modifications and equivalent arrangements are included within the spirit and scope of the appended claims.

What is claimed is:

1. An organic light emitting diode (OLED) display comprising:

first and second substrates;

an OLED interposed between the first and second substrates;

an external sealant formed between the first and second substrates and configured to i) substantially seal the first and second substrates and ii) substantially surround the OLED, wherein the external sealant is formed at least partially of a light curable material;

a dam formed between the external sealant and the OLED and configured to substantially surround the OLED, wherein the dam is formed at least partially of a thermosetting material and a moisture absorption material; and a getter formed between the external sealant and the dam, wherein the getter is formed of a material different from at least one of the external sealant and the dam.

2. The OLED display of claim 1, wherein the getter is configured to be cured from liquid to solid.

3. The OLED display of claim 1, further comprising an internal sealant formed between the external sealant and the getter.

4. The OLED display of claim 3, wherein the internal sealant is formed at least partially of a thermosetting material.

5. The OLED display of claim 1, wherein the getter is formed of a moisture absorption material.

6. The OLED display of any one of claims 1, 2-4, and 5, wherein the second substrate is an opaque substrate, and wherein the OLED is configured to emit light in a direction of the first substrate.

* * * * *